(12) United States Patent
Lering et al.

(10) Patent No.: US 6,732,855 B1
(45) Date of Patent: May 11, 2004

(54) CONVEYING ELEMENT AND CONVEYOR MEANS FOR CONVEYING WAFER RECEPTACLES, AND METHOD

(75) Inventors: Michael Lering, Bubenreuth (DE); Volker Tegeder, Weissig (DE); Clinton Haris, Dresden (DE)

(73) Assignees: Motorola, Inc., Schaumburg, IL (US); Semiconductor 300 GmbH & Co., Dresden (DE); Infineon Technologies AG, München (DE)

( * ) Notice: Subject to any disclaimer, the term of this patent is extended or adjusted under 35 U.S.C. 154(b) by 154 days.

(21) Appl. No.: 09/658,152

(22) Filed: Sep. 8, 2000

(51) Int. Cl.[7] .............................................. B65G 13/12
(52) U.S. Cl. ..................................... 198/782; 193/35 R
(58) Field of Search ......................... 193/35 R; 198/782

(56) References Cited

U.S. PATENT DOCUMENTS

| | | | | |
|---|---|---|---|---|
| 3,572,485 A | * | 3/1971 | Hardin ........................ 193/35 |
| 3,589,490 A | * | 6/1971 | Walkhoff .................. 193/35 R |
| 4,715,488 A | * | 12/1987 | Hewitt et al. .............. 193/35 R |
| 5,042,645 A | * | 8/1991 | Pritchard ..................... 198/782 |
| 5,127,513 A | * | 7/1992 | Huber ......................... 198/782 |
| 5,215,184 A | * | 6/1993 | Huber ......................... 198/782 |
| 5,301,785 A | * | 4/1994 | Plesh, Sr. ................. 193/35 R |
| 5,456,348 A | * | 10/1995 | Whetsel et al. ............. 198/812 |
| 5,547,069 A | * | 8/1996 | Pritchard ..................... 198/782 |
| 6,286,660 B1 | * | 9/2001 | Kalm .......................... 198/782 |
| 6,328,154 B1 | * | 12/2001 | Huber ......................... 198/782 |

* cited by examiner

Primary Examiner—Christopher P. Ellis
Assistant Examiner—Rashmi Sharma
(74) Attorney, Agent, or Firm—Kim-Marie Vo

(57) ABSTRACT

A conveyor element (10) for conveying wafer receptacles between a conveyor (12) and a loading station (11) of a manufacturing system in the semiconductor industry has a lifting mechanism (13) to move the wafer receptacle from a first position of the conveyor (12) or the loading station (11) into a second position of the conveyor (12) or of the loading station (11) substantially in a vertical direction. Rollers (14) are provided to move the wafer receptacle from the second position of the conveyor (12) along a substantially horizontal direction to the second position of the loading station (11) or from the second position of the loading station (11) to the second position of the conveyor (12).

11 Claims, 2 Drawing Sheets

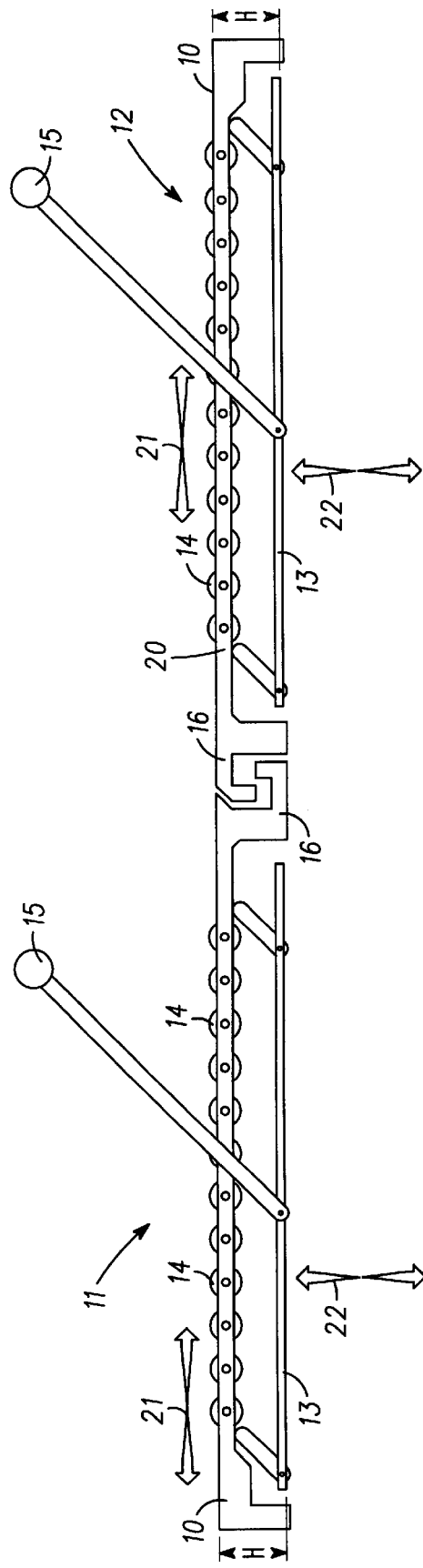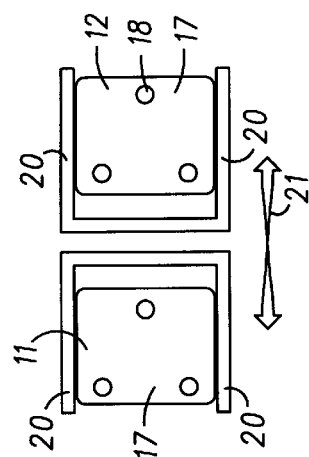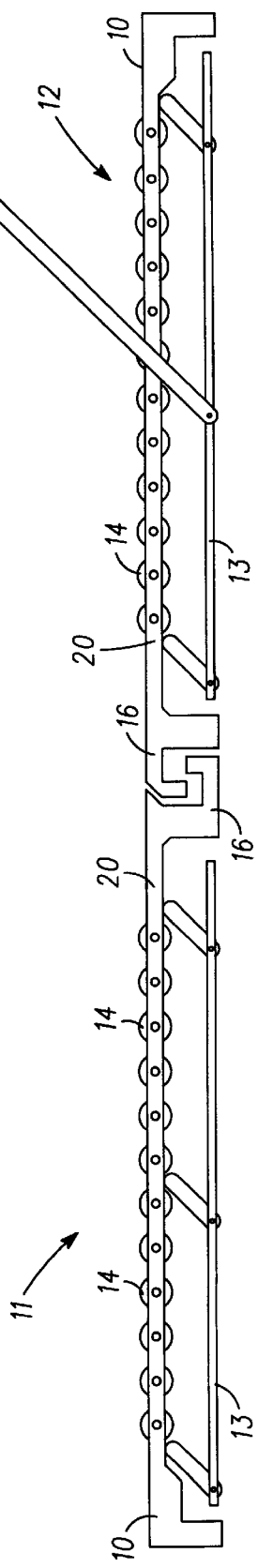
FIG. 1
FIG. 2
FIG. 3

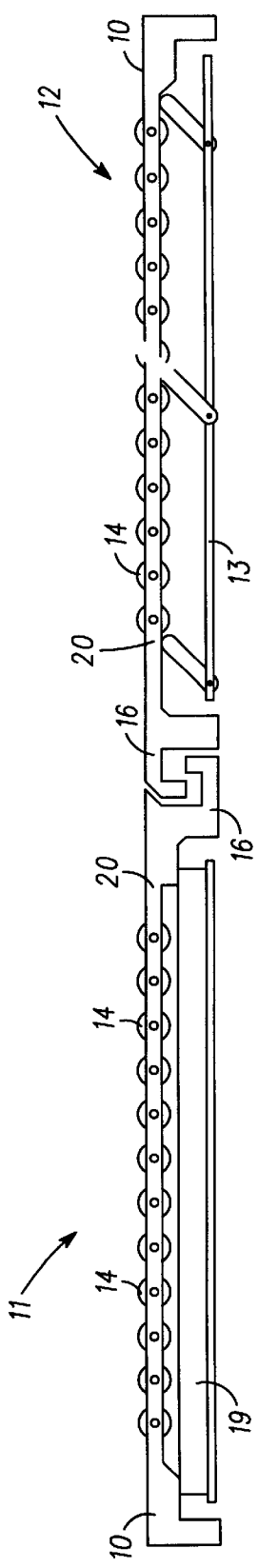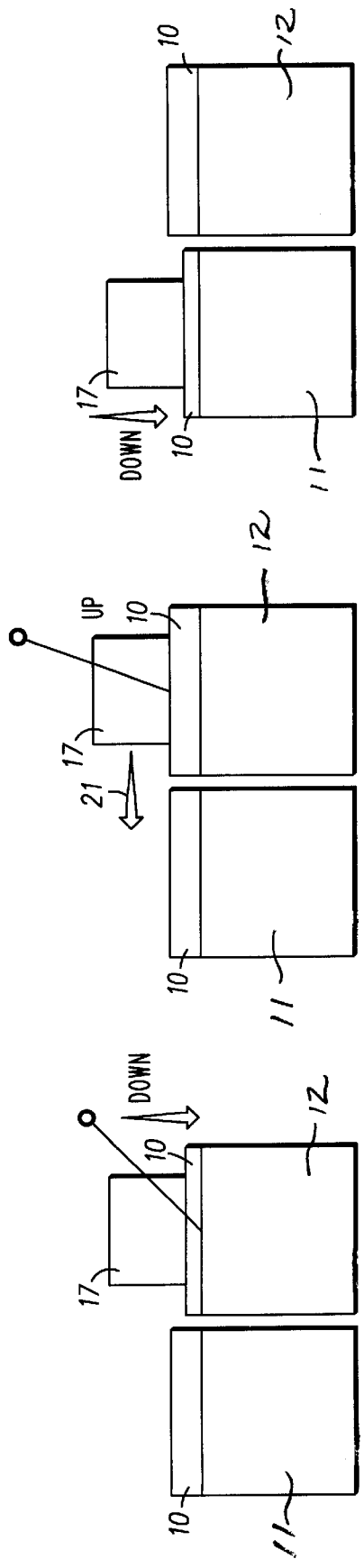

CONVEYING ELEMENT AND CONVEYOR MEANS FOR CONVEYING WAFER RECEPTACLES, AND METHOD

FIELD OF THE INVENTION

The present invention relates to a conveying element for conveying wafer receptacles between a conveyor means and a loading station of a manufacturing system in semiconductor industry, with the conveying element being adaptable to the conveyor system and/or the loading station. The invention moreover relates to a conveyor means for conveying wafer receptacles to a loading station and away from a loading station in a manufacturing system in semiconductor industry, and eventually the invention relates to a corresponding loading station. The invention finally relates to a method of conveying a wafer receptacle from a conveyor means to a loading station and in the opposite direction.

BACKGROUND OF THE INVENTION

Appropriate conveyor means, which may also be conveyor carriages, for instance, in particular, are common in the chip-manufacturing industry. Such conveyor carriages serve to convey wafer receptacles (commonly named FOUP, Front Opening Unified Pod). It is necessary to move appropriate wafer receptacles, which are loaded, for instance, with 25 wafers by means of an appropriate equipment—with a corresponding receptacle weighing 9 kilograms in the event that 300-mm wafers are loaded—because in compliance with the SEMI E 47.1 standard such receptacles are too heavy to be handled frequently by means. Such handling would violate the SEMI S8 standard in particular.

The wafer receptacles must be carried into loading or charging stations of the semiconductor manufacturing machinery for introducing the appropriate wafers into the production line or from removing finished wafers therefrom, respectively. As has been roughly indicted above, the wafer receptacles are too heavy for manual handling and particularly for a frequent rotating movement in the hip region. Furthermore, a manual operation or manual handling, respectively, is complicated and time-consuming and therefore expensive.

It is common to transfer appropriate wafer receptacles onto conveyor carriages by means of machinery whereupon the conveyor carriage is moved to a loading station either manually or automatically for docking or fastening, respectively, to the loading station. It is common to provide holding rails for appropriate fastening, which are mounted on the floor. Docking or connecting the conveyor carriage by means of the floor-mounted holding rails is very difficult particularly in ultra-clean rooms because the operators are completely dressed in protective clothing and can hardly see the floor and hence the connecting elements as such. Moreover, in correspondence with prior art a transfer mechanism of the wafer receptacle is provided on the conveyor carriage, which is present in the form of a complex lever mechanism.

It is the objective of the present invention to create some means facilitating the work of the operators or to provide an automatic device which can be used to transfer the loaded wafer receptacles rapidly from a conveyor carriage to a loading station or from a loading station to a conveyor carriage in a simple manner. The invention has the further objective to provide a method which allows for a simple and safe transfer of wafer receptacles without exposing the operators to any potential health hazard.

BRIEF DESCRIPTION OF THE DRAWINGS

FIG. 1 is a schematic side view of two conveying elements of a first inventive embodiment;

FIG. 2 is a plan view of two conveying elements disposed in a side-by-side relationship;

FIG. 3 shows a schematic side view of another variant of the present invention;

FIG. 4 illustrates a further embodiment of the present invention in a schematic side view; and FIG. 5 illustrates a method of the present invention by consecutive operation states of a carriage, a loading station, a conveyer element, and a wafer receptacle.

DETAILED DESCRIPTION OF THE DRAWINGS

In reference to FIGS. 1–4, the present invention is summarized as follows:

A conveyor element 10 for conveying wafer receptacles 17 (FIG. 2) between a conveyor means 12 and a loading station 11 of a manufacturing system in semiconductor industry is adaptable to the conveyor means 12 and the loading station 11. A lifting mechanism 13 is provided to substantially vertically (arrow 22) move the wafer receptacle 17 from a first position ("down") of the conveyor means (or the loading station) into a second position ("up") of the conveyor means 12 (or the loading station). Kinematic means move the wafer receptacle in a substantially horizontal direction (arrow 21) from the second position of the conveyor means 12 to the second position of the loading station (or from the second position of the loading station to the second position of the conveyor means 12).

Due to the inventive conveyor element a simple and safe handling of wafer receptacles is possible without violation of one of the aforementioned SEMI standards.

Appropriate conveyor elements are preferably arranged on one of the aforementioned conveyor carriages which do exist in prior art, without any substantial modifications on the existing conveyor carriages or conveyor means 12. It is preferably possible in correspondence therewith to mount an inventive conveyor element on a common loading station or charging station, respectively. It is particularly preferred that the conveyor elements satisfy the SEMI E 15.1 standard.

Preferably at least one conveying guide (e.g., rail 20 in FIG. 2) is provided which is adapted to be carried into operative connection with the wafer receptacle. Due to this preferred embodiment it is possible to guide the wafer receptacle reliably and safely. It is particularly preferred that the conveying guide comes into operative connection with the wafer receptacle in the raised position ("up") of the wafer receptacle.

A particularly simple and low-cost embodiment is preferably provided when the kinematic means comprise rotatable rollers 14 on which the wafer receptacle 17 can be moved. Two rolling rails are preferably provided whereof each comprises several rollers. Such rails with rollers could, for instance, also be imagined as roller blades turned upside down. When an actuator mechanism 13, 15 is preferably provided by means of which the rollers can be transferred from a first roller position into a second roller position and/or in the opposite direction a safe transfer of the wafer receptacle to the loading station is possible, particularly also at times by which the conveyor means 12 is not yet in the vicinity of the loading station.

The actuator mechanism preferably comprises an actuating lever 15, which allows a very simple mechanical operation in a particularly preferred form. When preferably a connecting element is provided by means of which the conveyor element 10 of the conveyor means 12 can be connected to the conveyor element 10 of the loading station 11, a particularly safe and reliable handling of the wafer receptacle and the wafers contained therein is possible. An even simpler handling is provided when the conveyor element is so improved that only one actuator mechanism (FIG. 3) is provided for actuating the conveyor element 10 (or elements), with the respective kinematic elements 14 being (or being adapted for) connected to each other in a particularly preferred form and for example, and when they can be raised and/or lowered, for instance, by means of an actuator mechanism at the same time.

The lifting mechanism is preferably pneumatic (FIG. 4).

It is moreover preferred to provide pneumatic kinematic means. When a pneumatic kinematic means is provided one could, for instance, provide nozzles which ensure that the wafer receptacle is raised under the action of air pressure in the manner of an air cushion or pad table and can thus be moved in a vertical direction 22 without exerting any substantial force. In this case, like in the embodiment of the kinematic means comprising rollers, it is sensible, for instance, to raise the wafer receptacle to a level so high that they will move out of the operating range of so-called kinematic pins which are common in the semiconductor industry for precise adjustment of wafer receptacles on the load port or station or on conveyor carriages, respectively.

The invention further provides conveyor means for conveying wafer receptacles to the loading station and away from the loading station of a manufacturing system in the semiconductor industry, wherein a connecting element is provided for the detachable connection of the conveyor means to the loading station and wherein the connecting element is approximately disposed at the level of an operating surface of the conveyor means or the loading station.

With these inventive provisions it is very easily possible to connect the conveyor means to the loading station. In this way a troublesome adjustment is avoided and the operators, who are usually heavily muffled in the ultra-clean room so that the sight is very substantially restricted, have an opportunity to see the connecting element very well because it is located at the level of an operating area of the conveyor means of the loading station. The operating area is preferably disposed at a height in the range from 80 cm to 100 cm from the floor. When the conveyor means preferably comprises wheels by means of which the conveyor means is movable it is possible for the operators in a simple manner to move this conveyor means.

The invention is, of course, not restricted to such conveyor means or conveyor carriages. Within the general scope of the invention an automatic movement of the conveyor means is also possible which could be moved in particular also by other mechanisms such as the movement of a crane system.

A conveyor means is preferably configured for the transfer of wafer receptacles to a loading station and away from a loading station of the manufacturing system in the semiconductor industry, particularly in the above described manner, and provided with a conveyor element of the kind described above.

The invention further provides a loading station for loading and/or unloading wafers in and/or from a manufacturing system in the semiconductor industry, wherein a connecting element is provided for detachably connecting a conveyor means to the loading station and wherein the connecting element is approximately arranged at the level of an operating surface of the loading station and/or the conveyor means. With such an inventive loading station it is possible to couple a conveyor means in a simple manner.

The operating surface is preferably disposed at a level of 80 cm to 100 cm from the floor, and particularly it is spaced by roughly 90 cm from the floor. It is moreover preferred that an aforementioned conveyor element is provided and disposed in particular in or on the loading station.

It is preferred to provide a manufacturing system for machining, processing and/or manufacturing semiconductor chips with at least one of the aforementioned loading station. It is furthermore preferred to provide at least one aforementioned conveyor means in such a manufacturing system.

The invention will now be described in the following without any restriction of the general inventive idea by exemplary embodiments with reference to the drawings which is referred to expressis verbis as far as the disclosure of all the inventive details is concerned which are not described in more details in the text.

In the following figures the same or corresponding parts are denoted by the same reference numerals so that a repeated discussion can be dispensed with whilst merely the variations of the embodiments shown in the Figures from the first embodiment will be explained.

FIG. 1 is a schematic side view of an inventive embodiment of two conveyor elements 10 which are coupled to each other. The conveyor element 10, which is arranged on the left side, is arranged on a load port 11. The load port 11 is only roughly outlined in this Figure and is not represented expressis verbis. The conveyor element is so designed that it is matched with the fork lift exclusion zone of the load port.

A conveyor element 10 is correspondingly mounted on a conveyor carriage or person-guided vehicle (PGV) which is not illustrated here. The conveyor elements 10 are provided approximately at the working level, i.e. at a level of some 900 mm. After docking of the conveyor carriage 12 to the load port 11 by connecting the connecting hook 16 to the associated hook 16 of the load port 11 it is possible to transfer wafer receptacles, FOUP, Front Opening Unified Pods. The connecting hooks 16 are illustrated in FIG. 1 in an enlarged view and schematically only. The arrows in the enlarged view depict the same elements. With the connection of these connecting hooks it is possible, for instance, to actuate a micro switch automatically, which results in the situation that FOUPs are not handled automatically as long respective operators are handling FOUPs. The operation of docking the conveyor carriages by an operator is very complicated and time-consuming. With connecting hooks 16 being provided approximately at the operating level of the operating tables, i.e. at a level of roughly 900 mm in correspondence with the SEMI E 51.1 standard, the docking operation is simplified correspondingly. The reason for this is the fact that the operator can easily see and hence properly align the clip, the hook ad/or the connecting mechanism. The connecting hook may be a positive locking means. However, the connection can also be formed by a screwed connection or a frictionally engaged connector such as a compressed assembly or a clamping connector. Furthermore, a serrated, cottered or bolted connection may be provided.

The micro switch serves as signal for manual loading or unloading.

The wafer receptacle 17 (cf. FIGS. 2 and 5), which is not illustrated in FIG. 1, rests on the roller 14. In this embodiment 2 roller rails are provided. These wheel rails or roller rails are carried in a raised position by means of a mechanical lever 15 for each conveyor element, e.g., over a distance of 13 mm, for removing and thus disengaging the wafer receptacle 17 from the holding elements 18 (kinematic coupling pins). After the appropriate disengagement from the holding means 18 it is possible to transfer the wafer receptacle from the load port to the conveying carriage or in the opposite direction without substantial force, with the receptacle being lowered again into the holding elements 18 at its destination.

FIG. 2 represents a schematic plan view of an inventive embodiment with conveyer element 10, loading station 11 and conveying carriage 12. The holding elements 18 are clearly visible in FIG. 2 (e.g., kinematic coupling pins to engage in grooves in receptacle 17). The position of wafer receptacles 17 in the load port 11 and the conveying carriage 12 is schematically indicated. Moreover, wheel rails 20 are shown on which the wafer receptacles 17 can be conveyed. Furthermore, a double arrow 21 (cf. FIG. 1) is schematically shown which is intended to represent the substantially horizontal movement of the wafer receptacle 17 between the load port 11 and the conveying carriage 12.

FIG. 3 illustrates another embodiment of the present invention. In distinction from FIG. 1 only one lever 15 is shown by means of which both the wheel rail 20 of the conveying carriage 12 and the wheel rail 20 of the load port 11 can be raised and lowered. To this end the respective mechanisms are appropriately connected to each other. The suitable connectors are common to the expert.

FIG. 4 shows a further embodiment of the invention. A pneumatic element 19 is provided in the conveyor element 10 of the load port for raising and lowering the wheel rails 20, which can be charged with compressed air so as to raise the wheel rail 20, e.g., by a distance of 13 mm, or from which the compressed air can be discharged for lowering the wheel rail 20.

Appropriate actuating mechanisms or levers can be mounted on the most different locations so as to facilitate operability. The levers are preferably designed for being detachably fixed. Moreover, provisions are preferably conceivable for automatic raising and lowering of the wheel rails. The wheel rails 20 preferably fit into the fork lift exclusion zone in compliance with the SEMI E 15.1 standard. The conveyor elements 10 for the load port 11 and the conveying carriage 12 are preferably designed as attachable add-on so that the existing conveying carriages and load ports need nor not essentially be modified for receiving the corresponding conveyor elements. During the raised phases both sides are preferably connected with each other or hooked together.

For the purposes of the present application the term "operating surface" is meant to cover also the terms operating plane, table surface, table plane, depositing plane and/or depositing area in particular, with operators having particularly a proper or comparatively simple access to these areas and/or planes.

It should now be clear for an expert that a conveyor element, a conveyor means, a loading station, a manufacturing system and a method of conveying a wafer receptacle from a conveyor means to a load port and in the opposite direction has been made available which leads to a facilitated handling of wafer receptacles which is additionally safe and rapid and hence low-cost.

FIG. 5 illustrates a method of the present invention by consecutive operation states of carriage 12 ("conveyor means"), load port 11, conveyer element 10, and wafer receptacle 17. The method of conveying a wafer receptacle 17 from a to a loading station 11 comprises the following steps:

raising the wafer receptacle 17 from a first position ("down") of the conveyor element 10, in which the wafer receptacle is engaged in at least one first holding element 18 (cf. FIG. 2), into a second position ("up") of the conveyor means out of the engagement range of the at least one first holding element (cf. FIG. 2, element 18); and moving the wafer receptacle 17 in a substantially horizontal direction 21 into a second position ("up") of the conveyor element 10 on the loading station 11 and lowering into a first position ("down") of the loading station in which the wafer receptacle is engaged in at least one second holding element (cf. FIG. 2, element 18).

With the inventive method it is particularly simple to transfer wafer receptacles rapidly and reliably.

The method of conveying a wafer receptacle from a loading station to a conveyor means is preferably performed with the aforementioned steps in a kinematic reverse succession. Hence in this arrangement initially the wafer receptacle 17 is transferred from a first position ("down") of the loading station 11, in which the wafer receptacle 17 is engaged in at least one second holding element, into a second position ("up") of the loading station out of the engagement range of the at least one second holding element. Then the wafer receptacle is moved into a second position ("up") of the conveyor element 10 in a substantially horizontal direction 21 whereupon the wafer receptacle is lowered into a first position ("down") of the conveyor means at which the wafer receptacle is engaged in at least one first holding element.

The raising and/or lowering operation is preferably performed with mechanical or pneumatic means. In the event of mechanical raising or lowering a handle or a lever, respectively, is provided for the operator in a particularly preferred design. In the event of pneumatic raising and/or lowering it is particularly preferable to provide bellows which inflate bellows and/or discharge after operation of a lever or a switch.

The horizontal translational movement is preferably performed via rotating rollers. It is moreover preferred to carry the rollers into an operative connection with the wafer receptacle for raising the wafer receptacle.

While the principles of this invention have been described herein it has to be clearly understood by those skilled in the art that this description is made only by way of example and not as a limitation of the scope of the invention. Accordingly it is intended to cover all such modifications of the invention by the appended claims, which fall within the true spirit and scope of the invention.

What is claimed is:

1. Conveyor element for conveying wafer receptacles between a conveyor means and a loading station of a manufacturing system in the semiconductor industry, wherein the conveyor element is adaptable to said conveyor means and to said loading station, characterized in that a lifting mechanism is provided by means of which said wafer receptacle is movable from a first position of said conveyor means or said loading station into a second position of said conveyor means or loading station substantially in a vertical direction, wherein the height of said conveyor means or said loading station in said second position is between approximately 80 to 100 centimeters from the floor, and that kinematic means for moving said wafer receptacle from said second position of said conveyor means along a substantially horizontal direction to the second position of said loading station or from the second position of said loading station to the second position of said conveyor means.

2. Conveyor element according to claim 1, characterized in that at least one conveyor guide is provided which is adapted to be carried into an operative connection with said wafer receptacle.

3. Conveyor element according to claim 1, characterized in that said kinematic means comprises rollers on which said wafer receptacle is movable in said horizontal direction.

4. Conveyor element according to claim 1, characterized in that a connecting element is provided by means of which the conveyor element of said conveyor means can be connected to the conveyor element of said loading station.

5. Conveyor element according to claim 1, characterized in that said lifting mechanism is pneumatic.

6. Conveyor element according to claim 1, characterized in that said kinematic means is pneumatic.

7. Method of conveying a wafer receptacle from a conveyor means to a loading station, comprising the following steps of operation:

raising said wafer receptacle from a first position of said conveyor means, in which said wafer receptacle is engaged in at least one first holding element, into a second position of said conveyor means out of the engagement range of at least one first holding element, wherein said second position is approximately 80 to 100 centimeters from the floor, moving said wafer receptacle in a substantially horizontal direction into a second position of said loading station, and lowering into a first position of said loading station in which said wafer receptacle is engaged in at least one second holding element.

8. Method of conveying a wafer receptacle from a loading station to a conveyor means, characterized in that the steps of method according to claim 7 are performed in a reverse kinematic succession.

9. Method according to claim 7, characterized in that the lowering and/or raising operations are performed mechanically and/or pneumatically.

10. Method according to claim 7, characterized in that the horizontal translational movement takes place via rotating rollers.

11. Method according to claim 7, characterized in that for raising said wafer receptacle said rollers are carried into an operative connection with said wafer receptacle.

* * * * *